(12) United States Patent  
Yamamoto

(10) Patent No.: US 6,677,229 B2  
(45) Date of Patent: Jan. 13, 2004

(54) SOLDER BUMP TRANSFER SHEET, METHOD FOR PRODUCING THE SAME, AND METHODS FOR FABRICATING SEMICONDUCTOR DEVICE AND PRINTED BOARD

(75) Inventor: Masaharu Yamamoto, Osaka (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 84 days.

(21) Appl. No.: 09/978,176

(22) Filed: Oct. 17, 2001

(65) Prior Publication Data

US 2002/0106883 A1 Aug. 8, 2002

(30) Foreign Application Priority Data

Oct. 20, 2000 (JP) ........................................ 2000-321050

(51) Int. Cl.[7] .............................................. H01L 21/44
(52) U.S. Cl. ........................ 438/613; 438/615; 438/616
(58) Field of Search ................................ 438/107, 613, 438/615, 616; 29/842

(56) References Cited

U.S. PATENT DOCUMENTS 5,667,849 A * 9/1997 Carey, II et al. ............ 427/431

6,432,807 B1 * 8/2002 Tsukui et al. ............... 438/613

FOREIGN PATENT DOCUMENTS

| JP | 03-145135 | 6/1991 | |
|----|-----------|--------|---|
| JP | 04-335532 | 11/1992 | |
| JP | 05-129363 | 5/1993 | |
| JP | 05-138396 | 6/1993 | |
| JP | 05-190602 | 7/1993 | |
| JP | 06-084922 | 3/1994 | |
| JP | 07-066545 | 3/1995 | |
| JP | 07-169767 | 7/1995 | |
| JP | 09217166 | * 8/1997 | ............. C23C/8/18 |
| JP | 10-098257 | 4/1998 | |
| JP | 10-135223 | 5/1998 | |
| JP | 11-312758 | 11/1999 | |

* cited by examiner

*Primary Examiner*—Tuan H. Nguyen  
*Assistant Examiner*—Nema Berezny  
(74) *Attorney, Agent, or Firm*—Nixon Peabody LLP; Jeffrey L. Costellia

(57) ABSTRACT

The method for producing a solder bump transfer sheet of the invention includes the steps of: providing a sheet having a chromium oxide layer containing substantially no iron oxide as the outermost surface; and forming a plurality of solder bumps placed in a predetermined pattern on the chromium oxide layer.

6 Claims, 4 Drawing Sheets

SOLDER BUMP TRANSFER SHEET, METHOD FOR PRODUCING THE SAME, AND METHODS FOR FABRICATING SEMICONDUCTOR DEVICE AND PRINTED BOARD

BACKGROUND OF THE INVENTION

1. Field of the Invention

The present invention relates to a solder bump transfer sheet, a method for producing the same, a method for fabricating a semiconductor device, and a method for fabricating a printed board. More particularly, the present invention relates to a method for producing a solder bump sheet used advantageously for connection of a semiconductor chip to a board of a package.

2. Description of Related Art

Solder bumps are used for connection between a semiconductor device and a circuit board and connection between a semiconductor chip and a circuit board in order to provide both electrical connection and mechanical connection.

The "semiconductor device" as used herein refers to a package of a semiconductor chip, including not only a package of a single semiconductor chip, but also a package of a plurality of semiconductor chips, such as a multi chip module (MCM). The "circuit board" as used herein includes not only a printed board on which a semiconductor device is mounted, but also a wiring board of a package on which a bare chip is mounted by flip chip bonding. The present invention is particularly advantageous when used for formation of narrow-pitch solder bumps. Herein, therefore, solder bumps for flip chip bonding will be described.

Paste printing and ball mounting are conventionally employed as methods for forming solder bumps. However, in paste printing, formation of fine bumps is difficult. It is also difficult to control the height (thickness) of bumps with high precision. In ball mounting, comparatively fine bumps can be formed. However, an expensive mounter is necessary to mount and press solder balls shaped into a perfect sphere (diameter: 0.76 mm ±0.02 mm, for example) at predetermined positions. This greatly increases production costs. Moreover, since handling of fine balls with reliability is difficult work, production efficiency decreases.

The present inventor disclosed a method for forming fine solder bumps using a solder bump transfer sheet in Japanese Laid-Open Patent Publication No. 11-312758, in which a film formed by plating is patterned by a photolithographic process, for example. By this method, fine bumps with a reduced variation in height (thickness) can be produced with great efficiency.

However, as a result of further investigation by the present inventor, it has been found that the solder bump transfer sheet disclosed in Japanese Laid-Open Patent Publication No. 11-312758 has a variation in the transferability, or the degree of transfer, of solder bumps. The disclosed transfer sheet has difficulty in transferring a large number of bumps, for example, more than 1000 bumps to a chip or the like with reliability, and this may cause decreases in the yield. This problem is more serious as the integrity of the semiconductor device enhances.

For solder bumps used for connection of a semiconductor chip having a large-capacity DRAM (for example, an ASIC), it is necessary to use a solder material of which the content of an α-ray source is small, to prevent the DRAM from malfunctioning due to an α-ray. Solder material costs for such a low α-ray are high (for example, three times as high as gold). Since the costs are high for this type of semiconductor chip itself, the overall production cost further increases. In consideration of this, improvement of the yield is strongly desired.

SUMMARY OF THE INVENTION

An object of the present invention is to provide a solder bump transfer sheet capable of transferring a number of fine solder bumps placed at high density on the transfer sheet with reliability, to provide a method for producing such a solder bump transfer sheet, and provide methods for fabricating a semiconductor device and a printed board using such a solder bump transfer sheet.

The method for producing a solder bump transfer sheet of the present invention includes the steps of: providing a sheet having a chromium oxide layer containing substantially no iron oxide as the outermost surface; and forming a plurality of solder bumps placed in a predetermined pattern on the chromium oxide layer.

Preferably, the sheet is a sheet having a conductive surface, the chromium oxide layer being formed on the conductive surface, and the plurality of solder bumps are formed by electroplating.

Preferably, the sheet is a stainless steel sheet, and the chromium oxide layer is formed by a process including a step of thermally oxidizing the conductive surface of the stainless steel sheet.

Preferably, the chromium oxide layer is formed on an underlying oxide layer containing an iron oxide formed on the surface of the stainless steel sheet, and the thickness of an oxide layer composed of the chromium oxide layer and the underlying oxide layer is 8 nm or more.

Preferably, the step of forming a plurality of solder bumps includes the steps of: forming a resist layer on the chromium oxide layer, the resist layer having a plurality of openings formed in a predetermined pattern; and depositing solder on portions of the chromium oxide layer exposed in the plurality of openings of the resist layer by electroplating.

In a preferred embodiment, the method further includes the step, prior to the step of depositing solder by electroplating, of washing the outermost surface of the stainless steel sheet with an acid aqueous solution.

Preferably, the step of washing the outermost surface is executed so that the thickness of the oxide layer composed of the chromium oxide layer and the underlying oxide layer increases by 5% or more as a result of the acid washing.

Preferably, the step of depositing solder by electroplating is executed at a current density of 0.5 A/dm$^2$ to 4 A/dm$^2$ by a rack plating method.

The solder bump transfer sheet of the present invention has substantially the same structure as that of a solder bump transfer sheet produced by any of the methods for producing a solder bump transfer sheet described above in the prior art.

The method for fabricating a semiconductor device of the present invention is a method for fabricating a semiconductor device including a semiconductor chip mounted on and connected to a wiring board. The method includes the steps of: providing a semiconductor chip having a plurality of pads placed in a predetermined pattern; providing a solder bump transfer sheet having a plurality of solder bumps placed to correspond to the predetermined pattern of the plurality of pads, which is a solder bump transfer sheet having substantially the same structure as that of a solder bump transfer sheet produced by any of the methods for producing a solder bump transfer sheet described above; transferring the plurality of solder bumps of the solder bump transfer sheet to the plurality of pads of the semiconductor chip; and connecting the semiconductor chip to a wiring board via the plurality of solder bumps.

The method for fabricating a printed board of the present invention is a method for fabricating a printed board including interconnections and a plurality of solder bumps formed on a substrate. The method includes the steps of: providing a substrate on which interconnections and a plurality of pads in a predetermined pattern are formed; providing a solder bump transfer sheet having a plurality of solder bumps placed to correspond to the predetermined pattern of the plurality of pads, which is a solder bump transfer sheet having substantially the same structure as that of a solder bump transfer sheet produced by any of the methods for producing a solder bump transfer sheet described above; and transferring the plurality of solder bumps of the solder bump transfer sheet to the plurality of pads on the substrate.

DETAILED DESCRIPTION OF THE INVENTION

Figure 1A:
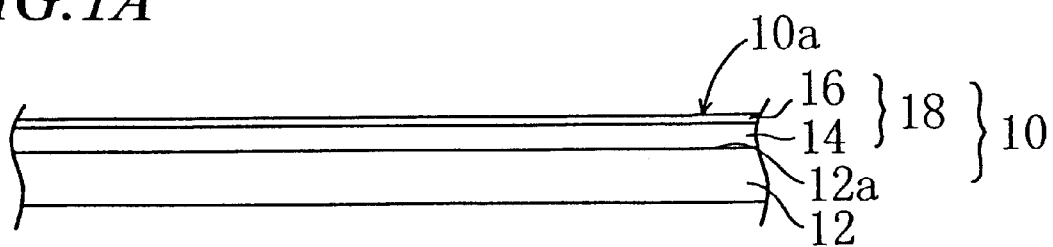
FIGS. 1A and 1B are schematic cross-sectional views of a solder bump transfer sheet undergoing the method for producing a solder bump transfer sheet of the present invention.
Figure 1B:
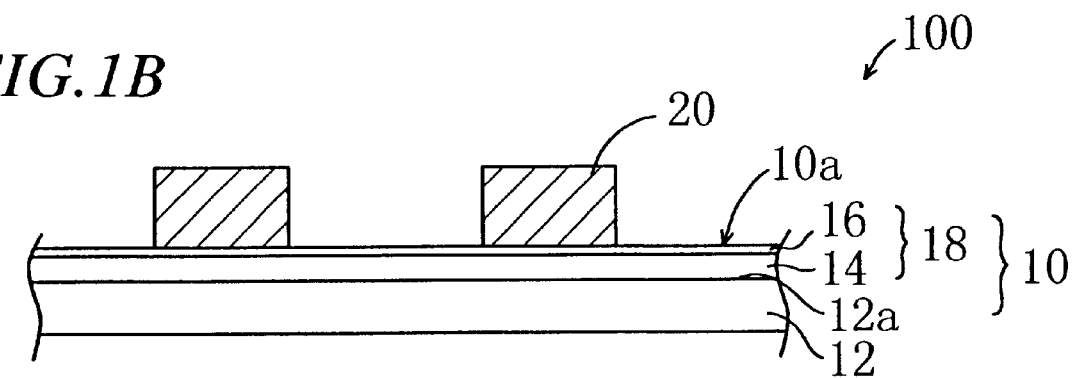

A structure of a solder bump transfer sheet of an embodiment of the present invention, as well as a production method thereof, will be described with reference to FIGS. 1A and 1B. FIGS. 1A and 1B show schematic cross-sections of the solder bump transfer sheet by the process steps of the production method of the present invention.

Referring to FIG. 1A, a sheet 10 having a solder receiving surface 10a is provided. The sheet 10 has a conductive surface 12a, and includes a chromium oxide layer 16 containing substantially no iron oxide that is located above the conductive surface 12a and constitutes the outermost surface of the sheet 10. That is, the solder receiving surface 10a of the sheet 10 is the surface of the chromium oxide layer 16. A stainless steel sheet is preferably used as a base sheet 12, and in the case of using the stainless steel sheet, an underlying oxide layer 14 containing an iron oxide exists on the conductive surface 12a. The underlying oxide layer 14 and the chromium oxide layer 16 together are herein called an oxide layer 18.

Referring to FIG. 1B, a plurality of solder bumps 20 are formed on the chromium oxide layer 16 in a predetermined pattern by electroplating, to thereby produce a solder bump transfer sheet 100.

The present invention was attained by closely examining the relationship between the composition of the solder receiving surface 10a and the transferability of the solder bumps 20.

It is preferable to employ electroplating for formation of the solder bumps 20. The electroplating method is advantageous in that fine solder bumps can be easily formed, and also the height (thickness) of the solder bumps 20 can be controlled with high precision (for example, ±5 $\mu$m). To suppress variation in plating conditions, in particular, a rack plating method is preferably adopted.

In the case where electroplating is employed, a sheet having a conductive surface is used as the base sheet 12 of the solder bump transfer sheet. As the base sheet 12, a passivated stainless steel sheet (for example, SUS 430) may be preferably used, for example. A stainless steel sheet is advantageous in that not only it has a conductive surface but also it is easily available and inexpensive. Moreover, the surface of a stainless steel sheet, which is low in wettability against solder, tends to give high transferability. In general, a naturally-oxidized film is formed on the surface of a stainless steel sheet. Herein, however, it is assumed that the stainless steel sheet 12 includes no naturally-oxidized film, for simplification of the description.

For example, Japanese Laid-Open Patent Publication No. 11-312758 describes a method in which a naturally-oxidized film is utilized to secure good transferability of solder bumps and for this purpose a Fe—Cr alloy (SUS 430) is used as the base sheet. This publication describes that due to low surface wettability of a $Cr_2O_3$ film formed on the surface of the Fe—Cr alloy, solder bumps formed on the film easily come off from the film and thus good transfer of the solder bumps is attained. The present inventor closely examined the transferability of a large number of fine solder bumps placed at high density (for example, a diameter of bumps of 0.2 mm or less, an inter-bump pitch of about 1.5 to 1.7 times as large as the bump diameter, and the number of bumps of 2000 or more) using a SUS 430 sheet. As a result, no satisfactory transferability was obtained, as will be described later with reference to the experiments results.

The present inventor studied the above matter in various aspects, focusing on the relationship between the surface roughness and composition of the solder receiving surface of the SUS 430 sheet and the transferability of solder bumps. As a result, it was found that, as long as the surface roughness (Rz) was 1 $\mu$m or less, the surface composition, rather than the surface roughness, largely influenced the transferability.

More specifically, as a result of ESCA analysis of the surface composition of the SUS 430 sheet, it was found that the outermost surface of a naturally-oxidized film formed on the SUS 430 sheet (that is, the solder receiving surface) contained not only $Cr_2O_3$ but also $CrO_x$ (X indicates that the oxidation number is indefinite) and $Fe_2O_3$. There was another finding that, when the surface of the SUS 430 sheet was thermally oxidized, a layer made of a chromium oxide (including $Cr_2O_3$ and $CrO_x$) containing substantially no iron oxide was formed as the outermost surface, and this provided good transferability.

From the above, it is clear that the transferability of solder bumps deteriorates when the solder receiving surface includes $Fe_2O_3$ and the transferability is improved when a chromium oxide layer containing substantially no iron oxide is formed as the solder receiving surface. Based on these findings, in the method for producing a solder bump transfer sheet of the present invention, the chromium oxide layer 16 containing substantially no iron oxide is formed as the outermost surface of the sheet, to thereby improve the transferability of the solder bumps.

In the case where electroplating is employed for formation of the solder bumps 20, a stainless steel sheet may be advantageously used as the base sheet 12. However, excellent transferability of the solder bumps 20 may be obtained as long as solder is deposited on the surface of the chromium oxide layer 16. In consideration of these, in order to obtain the effect of the present invention, the chromium oxide layer 16 as the outermost surface may be formed by some method or another. For example, by forming a Fe—Cr alloy layer on a glass surface and thermally oxidizing the layer, the chromium oxide layer 16 (together with the underlying oxide layer 14) can be formed.

The phrase "containing substantially no iron oxide" as used herein indicates that no iron oxide is detected by ESCA surface composition analysis. Note that, under the chromium oxide layer 16 as the outermost surface of the sheet 10, the underlying oxide layer 14 containing an iron oxide is also formed by the thermal oxidation, and the chromium oxide layer 16 is a very thin layer. The thermal oxidation may be performed under various conditions. For example, the temperature may be raised to 250° C. to 850° C. in an atmosphere of 75% of hydrogen gas and 25% of nitrogen gas. The heating time is not specifically limited as long as the sheet reaches the above range of temperature. To ensure excellent transferability, the thermal oxidation is preferably performed so that the thickness of the oxide layer 18 composed of the underlying oxide layer 14 and the chromium oxide layer 16 is 8 nm or more.

In the method for producing a solder bump transfer sheet, the solder receiving surface is preferably washed with an acid aqueous solution prior to the deposition of solder by electroplating. If the surface of the chromium oxide layer on which solder is to be deposited is contaminated, uniform deposition of solder and sufficient adhesion strength may not be obtained. The solder receiving surface 10a needs to have proper releasability from molten solder, and at the same time needs to have proper adhesion to the solder bumps 20 in the solid state until the solder bumps 20 are melted. For attainment of the proper adhesion, the surface state of the solder receiving surface and the current density during electroplating, to be described later, are influential factors.

During the acid washing, the thickness of the oxide layer (including the underlying oxide layer and the chromium oxide layer) that provides the solder receiving surface tends to increase with time. In order to secure a satisfactory effect of the acid washing, the acid washing is preferably performed so that the thickness of the oxide layer increases by 5% or more of that before the acid washing. However, if the acid washing continues for an excessively long time, the chromium oxide layer as the outermost surface may possibly come off. Therefore, the conditions and time of the acid washing are preferably controlled so that the thickness of the oxide layer does not increase by about 26% or more. The thickness of the oxide layer after the acid washing is preferably 8 nm or more.

Specific conditions for the acid washing are as follows. For example, when the acid washing includes immersing the sheet in an aqueous solution of 17.5 wt. % of hydrochloric acid as will be described later, the immersing time is preferably 15 minutes or less. The type of the aqueous solution, the washing method, and the washing time for the acid washing may be changed appropriately. However, the acid washing method specified above is preferred because by employing this method good transferability is attainable when the immersing time is in the range of 3 to 15 minutes, and this provides a sufficiently wide process margin for the acid washing process. As an alternative method for cleaning the solder receiving surface, ion sputtering may be employed.

For formation of the fine solder bumps 20, photolithography is preferably used from the standpoint of productivity. In particular, the following photolithographic method is preferably employed. A resist layer having a plurality of openings in a predetermined pattern is formed on the chromium oxide layer 16 as the solder receiving surface 10a. Solder is then deposited by electroplating on portions of the chromium oxide layer 16 exposed in the openings. By adopting this method, in which the solder is deposited only inside the openings, the yield improves compared with a method in which solder deposited over the entire surface is patterned. Therefore, this method is particularly effective when an expensive material such as low α-ray solder (e.g., Sn-base Pb-free solder) is used.

The electroplating is preferably performed by a rack plating method, in particular, with a current density of 0.5 A/dm$^2$ to 4 A/dm$^2$ with the sheet 10 being immobilized. If the current density exceeds 4 A/dm$^2$, satisfactory transferability may not be obtained. If it is less than 0.5 A/dm$^2$, the adhesion may be too low. In addition, if the current density is too low, the plating rate decreases, and it takes long time to deposit a predetermined thickness of solder. Therefore, in consideration of workability and mass-productivity with respect to the yield, the current density is preferably 0.5 A/dm$^2$ or more, more preferably 1 A/dm$^2$ or more.

The solder bumps may also be formed by thermal spraying or evaporation. Alternatively, solder foil may be bonded to the surface of the sheet by pressing (see Japanese Laid-Open Patent Publication No. 11-312758, for example). The disclosure of Japanese Laid-Open Patent Publication No. 11-312758 is incorporated herein by reference. In the situations where a method other than electroplating is employed, it is not necessary that the solder receiving surface 10a of the sheet 10 has conductivity. The excellent transferability may be attained as long as the sheet 10 has the chromium oxide layer 16 as the outermost surface.

As the solder material, use of 95Pb-5Sn solder is preferred. However, since the adhesion (in the solid state) to and the releasability (in the molten state) from a chromium oxide are roughly the same among various types of generally used solder materials, other types of solder materials may be used. The "solder" as used herein refers to the solder in a broad sense, including an Sn-base Pb-free solder (e.g., Sn—Ag, Sn—Cu, Sn—Zn, Sn—In, and Sn—Bi solder) in addition to Pb—Sn solder.

The solder bumps 20 for transfer produced in the manner described above have excellent transferability. It is therefore possible to transfer a number of fine solder bumps placed at high density with reliability. Accordingly, by using the solder bump transfer sheet 100 described above, a high-performance semiconductor device 200 having a large number of input/output terminals shown in FIG. 2, for example, can be fabricated with good efficiency.

Figure 2:
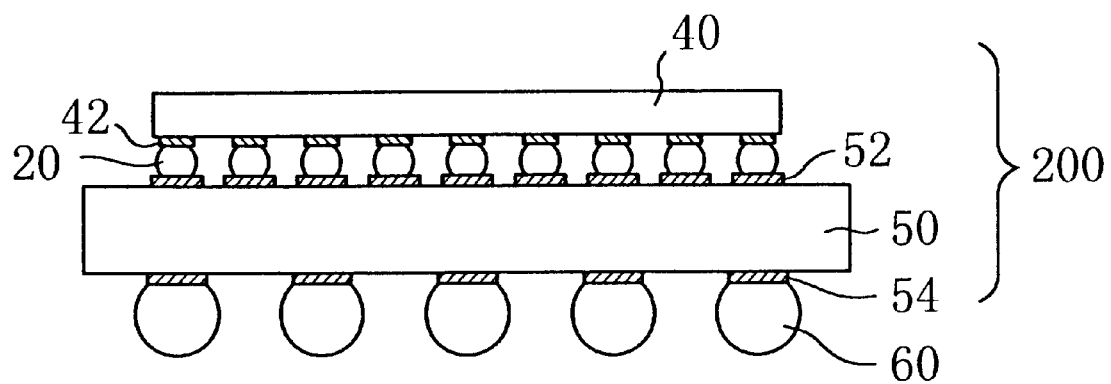
FIG. 2 is a schematic view of a semiconductor device 200 fabricated by a method of an embodiment of the present invention.

Referring to FIG. 2, a semiconductor chip 40 of the semiconductor device 200 is connected to a wiring board 50 of a package by flip chip bonding. More specifically, pad electrodes 42 of the semiconductor chip 40 are connected with pad electrodes 52 of the wiring board 50 via the solder bumps 20.

The semiconductor device 200 is fabricated using the solder bump transfer sheet 100 in the following manner.

First, the solder bumps 20 of the solder bump transfer sheet 100 are transferred to the pad electrodes 42 of the semiconductor chip 40 by a known reflowing process. Note, that the solder bumps 20 of the solder bump transfer sheet 100 are placed at positions corresponding to the pattern of the pad electrodes 42 of the semiconductor chip 40.

The semiconductor chip 40 with the solder bumps 20 transferred thereto is then aligned with the wiring board 50 so that the solder bumps 20 correspond to the pad electrodes 52 of the wiring board 50. The solder bumps 20 are then connected to the pad electrodes 52 by reflowing again.

The thus-fabricated semiconductor device 200 is mounted on a circuit board (printed board, for example) not shown via input/output terminals 54 of the wiring board 50. In this mounting, the semiconductor device 200 is connected to the printed board via metal bumps 60, for example. The solder bump transfer sheet 100 of the present invention is advantageously used for formation of fine solder bumps placed at high density as described above. In addition, if required, the solder bump transfer sheet 100 may be used for formation of the metal bumps 60 for mounting the semiconductor device 200 on the printed board.

Hereinafter, an example of the solder bump transfer sheet and the method for producing the same of the present invention, as well as comparative examples thereof, will be described. In this example, a total of 2916 (54×54) bumps (for one semiconductor chip) each having a diameter of 0.16 mm, a pitch of 0.24 mm, and a height of 0.1 mm were formed.

A method for producing a solder bump transfer sheet of this example will be described with reference to FIGS. 3A to 3D.

Figure 3A:
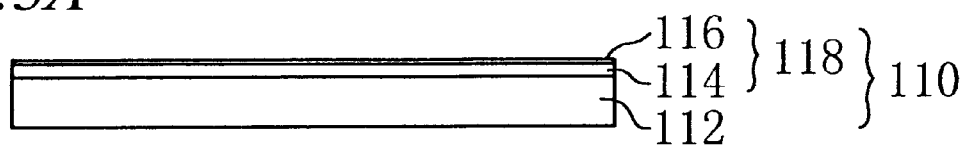
FIGS. 3A, 3B, 3C, and 3D are schematic cross-sectional views of a solder bump transfer sheet during the method for producing a solder bump transfer sheet by one embodiment of the present invention.

Referring to FIG. 3A, a sheet 110 including a chromium oxide layer 116 as the outermost surface is provided. The sheet 110 includes an as-rolled stainless steel (SUS 430) base sheet 112, and also includes an underlying oxide layer 114 containing an iron oxide and the chromium oxide layer 116 formed in this order on the base sheet 112 by thermally oxidizing the surface of the stainless steel sheet 112. Specifically, an as-rolled SUS 430 sheet having a thickness of 0.1 mm was heated to a temperature of 800° C. in an atmosphere of 75% of hydrogen gas and 25% of nitrogen gas, to obtain the sheet 110 of this example. The sheet 110 is also available from various steel lumber makers.

As comparative example 1, an as-rolled SUS 430 sheet (not thermally oxidized as described above) was provided. As comparative example 2, a sheet obtained by buffing the thermally-oxidized as-rolled SUS 430 sheet used in the example of the present invention was prepared.

The resultant sheet 110 is then machined into a predetermined shape as required. In this example, the sheet 110 was shaped into an 18 mm-side square by etching.

The sheets of this example and comparative examples 1 and 2 were analyzed for the surface composition by ESCA (with ESCA-850 manufactured by Shimadzu Corp., etching rate: 2.5 nm/min). Table 1 below shows the results of the analysis. Table 1 also shows the results of surface analysis after the acid washing process and the evaluation results of formability and transferability of solder bumps, which are to be described later.

As shown in Table 1 (field of "raw material"), the sheet 110 of this example had the chromium oxide layer 116 (including $Cr_2O_3$ and $CrO_x$) as the outermost surface, and the thickness of the oxide layer 118 composed of and the chromium oxide layer 116 and the underlying oxide layer 114 was 9.5 nm. On the contrary, in comparative examples 1 and 2, a layer containing an iron oxide (including $Fe_2O_3$) and a chromium oxide was formed as the outermost surfaces of the sheets, and the thicknesses of the oxide layers were 6.5 nm and 5.6 nm, respectively, which were comparatively thin.

In the following process steps, description will be made only for the solder bump transfer sheet of the example of the present invention. Note that solder bump transfer sheets of comparative examples 1 and 2, which are only different from the example of the present invention in the surface structure and composition, were produced in substantially the same manner.

Figure 3B:
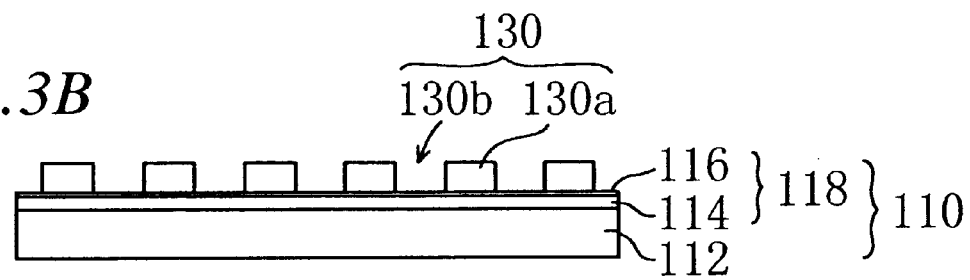

Referring to FIG. 3B, a resist layer 130 having openings 130b in a predetermined pattern is formed on the chromium oxide layer 116 of the sheet 110. The remaining portions of the resist layer 130 that actually have the resist are referred to as resist portions 130a.

The openings 130b have a diameter of 0.16 mm that is equal to the diameter of solder bumps to be formed, and the resist portions 130a are formed at a pitch of 0.24 mm. The thickness of the resist layer 130 is set equal to or larger than the height of the solder bumps to be formed. By this setting, the height of the solder bumps to be formed will be as high as or lower than the thickness of the resist layer 130 (i.e., the depth of the openings 130b). By forming the solder bumps in this way, the solder bumps can be controlled to have a constant shape.

The resist layer 130 may be formed by a known photolithographic process. Specifically, the resist layer 130 is formed by exposing a resist to light via a photomask having a predetermined pattern and developing the resist. When a dry film resist is used, in particular, the thickness of the resist layer 130 can be easily and precisely controlled. The dry film resist is also advantageous in that the comparatively thick resist layer 130 can be formed in a short time.

Prior to the start of the next electroplating process, surface portions of the chromium oxide layer 116 exposed in the openings 130b of the resist layer 130 are showered with water and then washed with an acid aqueous solution. If the surface of the chromium oxide layer 116 on which solder is to be deposited is contaminated, uniform deposition of solder and sufficient adhesion strength may not be obtained. Occurrence of insufficient deposition of solder is indicated as the incidence of bumps having chips (defective bumps) in Table 1. To be more specific, the percentage of the number of defective bumps with respect to the 2916 bumps is shown for the example of the present invention and comparative examples 1 and 2.

As the solution for the acid washing, an aqueous solution of 17.5 wt. % of hydrochloric acid was used. The acid washing time, that is, the time during which the sheet was immersed in the aqueous hydrochloric acid solution was varied in the range of 0 to 20 minutes, and the subsequent process steps were executed under the same conditions, to produce solder bump transfer sheets. In this way, the influence of the acid washing time on the resultant solder bump transfer sheets was examined.

After the acid washing, each sheet was immersed in a liquid of an acid component of a solder plating solution (that is, a liquid containing no solder) before being subjected to solder plating. The data in the field of acid washing time 0 in Table 1 show the surface analysis results by ESCA after the washing with the liquid of an acid component of the solder plating solution.

As is recognized from Table 1, as for the sheet of the example of the present invention, the thickness of the oxide layer 118 gradually increased as the acid washing time was longer. When the acid washing time was 20 minutes, however, the thickness of the oxide layer 118 decreased, and moreover, the chromium oxide layer 116 was not detected as the outermost surface. From these, it is presumed that the oxide layer 118 partly came off. In the sheet of this example, defective bumps were hardly generated when the acid washing time was 2 minutes or more, and no defective bumps were generated when the acid washing time was 3 minutes or more.

As for the thickness of the oxide layer 118, in order to obtain the effect of the acid washing sufficiently, the acid washing should preferably be performed so that the thickness of the oxide layer 118 increases by about 5% or more, preferably by about 14% or more of the thickness before the acid washing. If the acid washing is performed for an excessively long time, the chromium oxide layer constituting the outermost surface may come off. Therefore, the conditions and time of the acid washing are preferably controlled so that the thickness of the oxide layer does not increase by about 26% or more.

For the sheets of comparative examples 1 and 2, no defective bumps were generated when the sheets were acid-washed for 2 minutes or more. When these sheets were acid-washed for 20 minutes, the resist layer 130 partially disjoined (delaminated) from the sheet. In this case, therefore, evaluations of the incidence of defective bumps and the transfer failure ratio were not possible. In comparative example 2, the thickness of the oxide layer varies with the acid washing time. This is probably because the thickness of the oxide layer increases due to passivation of the stainless steel by the acid washing while it decreases due to elution of the oxide layer, and these increase and decrease of the thickness are repeated. The surface roughness (Rz) of the sheet 110 of the example of the present invention and that of the sheet of comparative example 1 were 0.5 $\mu$m and 0.8 $\mu$m, respectively.

Figure 3C:
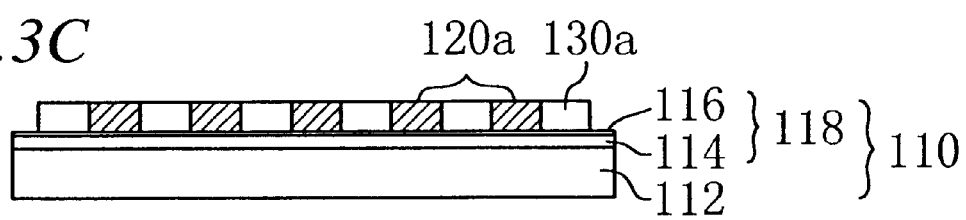

Thereafter, referring to FIG. 3C, solder 120 is deposited in the openings 130b of the resist layer 130 by electroplating. As the solder plating solution, an alkanol sulfonic acid, 95Pb-5Sn solution was used. The current density was 1 mA/dm$^2$, and the temperature of the plating solution was about 20° C. Under these conditions, the solder 120 was deposited to a thickness of 0.1 mm in about 150 minutes.

Figure 3D:
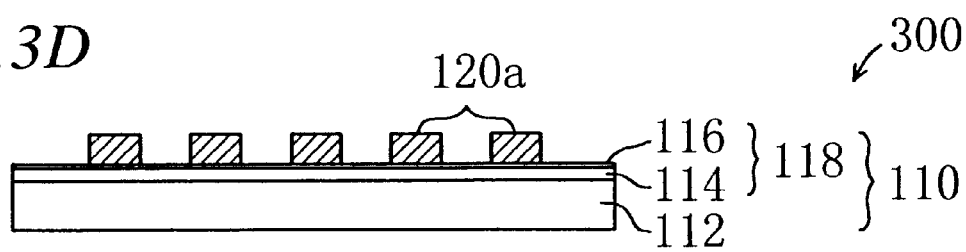

Referring to FIG. 3D, the resist layer 130 is removed. In this example, an alkaline remover solution was used to remove the resist layer 130. The resultant sheet was washed with water and dried, to obtain a solder bump transfer sheet 300.

The bump transferability of the solder bump transfer sheet 300 of this example and that of each of the solder bump transfer sheets of the comparative examples were then evaluated. This evaluation of transferability was performed by executing transfer using a known reflowing process. The reflowing was performed in a nitrogen atmosphere at about 350° C.

As is shown in Table 1, the solder bump transfer sheet 300 of this example, produced from the sheet 110 including the SUS 430 sheet and the chromium oxide layer 116 as the outermost surface, had a transfer ratio of 100% when the acid washing time was in the range of 3 to 15 minutes, and caused no generation of defective bumps. It is therefore found that the solder bump transfer sheet of this example has excellent transferability.

The as-rolled SUS 430 sheet of comparative example 1 had a transfer ratio of 100% only when the acid washing time was 2 minutes and the thickness of the oxide layer was 8.0 nm. This suggests the possibility of attaining excellent transferability without forming the chromium oxide layer if the acid washing conditions and the thickness of the oxide layer are appropriately controlled. However, since the process margin for the acid washing time is narrow in this case, application to mass-production is difficult.

The above results suggest that the thickness of the oxide layer should preferably be 8 nm or more as a condition for attaining excellent transferability. As described above, the first factor for improvement of the transferability is to form the chromium oxide layer as the outermost surface. However, if the thickness of the oxide layer is too thin, the surface of the underlying layer may partly be exposed, or the compactness of the oxide layer may decrease. These presumably cause reduction in transferability. As described above, by using the solder bump transfer sheet produced by the method of the present invention, about 3000 bumps were successfully transferred by one operation with the transfer ratio of 100%.

TABLE 1

| Acid Washing Time (min) | Comparative Example 1 As rolled | | | | Example Heat-treated | | | | Comparative Example 2 Heat-treated + Buffed | | | |
|---|---|---|---|---|---|---|---|---|---|---|---|---|
| | Oxide Thickness (nm) | Outermost Surface Oxide | Defective Bump (%) | Transfer Ratio (%) | Oxide Thickness (nm) | Outermost Surface Oxide | Defective Bump (%) | Transfer Ratio (%) | Oxide Thickness (nm) | Outermost Surface Oxide | Defective Bump (%) | Transfer Ratio (%) |
| Raw Material | 6.5 | $Fe_2O_3$, Cr-oxide | | — | 9.5 | Cr-oxide | | — | 5.6 | $Fe_2O_3$, Cr-oxide | | — |
| 0 | 6.7 | $Fe_2O_3$, Cr-oxide | 30 | — | 9.7 | Cr-oxide | 50 | — | 6.0 | $Fe_2O_3$, Cr-oxide | 5 | — |
| 2 | 8.0 | $Fe_2O_3$, Cr-oxide | 0 | 100 | 10.0 | Cr-oxide | 0.04 | 100 | 4.0 | $Fe_2O_3$, Cr-oxide | 0 | 10 |
| 3 | 7.0 | $Fe_2O_3$, Cr-oxide | 0 | 90 | 10.8 | Cr-oxide | 0 | 100 | 4.0 | $Fe_2O_3$, Cr-oxide | 0 | 15 |
| 5 | 6.0 | $Fe_2O_3$, Cr-oxide | 0 | 50 | 11.0 | Cr-oxide | 0 | 100 | 4.5 | $Fe_2O_3$, Cr-oxide | 0 | 20 |
| 10 | 6.2 | $Fe_2O_3$, Cr-oxide | 0 | 70 | 12.0 | Cr-oxide | 0 | 100 | 5.6 | $Fe_2O_3$, Cr-oxide | 0 | 50 |
| 15 | 7.0 | $Fe_2O_3$, Cr-oxide | 0 | 80 | 11.0 | Cr-oxide | 0 | 100 | 7.0 | $Fe_2O_3$, Cr-oxide | 0 | 80 |
| 20 | 7.1 | $Fe_2O_3$, Cr-oxide | — | — | 7.3 | $Fe_2O_3$, Cr-oxide | 0 | 95 | 7.2 | $Fe_2O_3$, Cr-oxide | — | — |

The solder bump transfer sheet of the present invention is advantageous when used for formation of solder bumps of a multi-pin semiconductor chip as described above. However, the application of the present invention is not limited to this.

Figure 4:
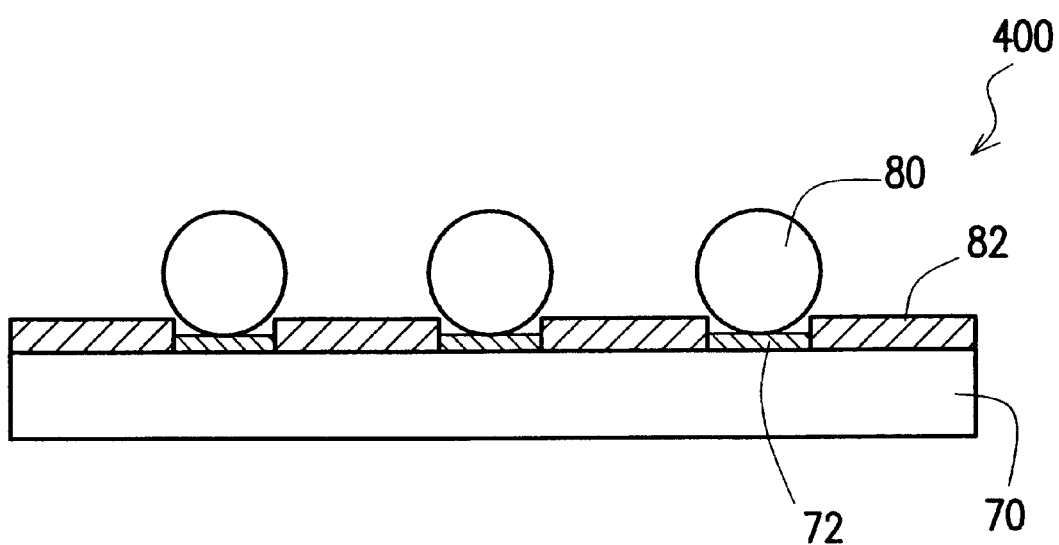
FIG. 4 is a schematic view of a printed board 400 fabricated by a method of another embodiment of the present invention.

For example, as shown in FIG. 4, the solder bump transfer sheet of the present invention may also be used for formation of solder bumps 80 of a printed board 400 on which a semiconductor chip and/or a semiconductor device is to be mounted. The printed board 400 has landmarks (pad electrodes) 72 formed on a ceramic substrate 70. The solder bumps 80 are formed on the landmarks 72 using the solder bump transfer sheet of the present invention. The portions of the surface of the ceramic substrate 70 other than the landmarks 72 are covered with a protection layer 82. The printed board 400 can be fabricated in substantially the same manner as that described above with reference to FIG. 2, for example. A polyimide substrate or the like may be substituted for the ceramic substrate 70 of the printed board 400. The solder bump transfer sheet of the present invention, which is excellent in transferability, can also be applied advantageously to fabrication of a flexible printed board.

The present invention provides the method for producing solder bump transfer sheet capable of transferring a number of fine solder bumps placed at high density with reliability. By using the resultant solder bump transfer sheet, solder bumps of a semiconductor chip having more than 2000 pins can be formed efficiently with reliability.

The solder bump transfer sheet produced by the method of the present invention can be used for formation of bumps of a semiconductor chip that have a still smaller diameter (for example, 0.1 mm or less) and are placed at high density. The present invention therefore provides an important technique for realization of further downsized semiconductor devices with higher performance and higher speed.

In addition, by using the solder bump transfer sheet of the present invention, a printed board having a number of fine solder bumps placed at high density can be fabricated with high efficiency.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A method for producing a solder bump transfer sheet, comprising the steps of:
    forming on the surface of a stainless steel sheet a chromium oxide layer as an outermost surface wherein the chromium oxide layer contains substantially no iron oxide formed during formation of the bromium oxide layer; and
    forming a plurality of solder bumps placed in a predetermined pattern on said chromium oxide layer,
    wherein said stainless steel sheet has a conductive surface, said chromium oxide layer being formed on said conductive surface, and said plurality of solder bumps are formed by electroplating,
    said chromium oxide layer is formed by a process including a step of thermally oxidizing the conductive surface of said stainless steel sheet, and
    said step of forming a plurality of solder bumps comprises the steps of:
        forming a resist layer on said chromium oxide layer, the resist layer having a plurality of openings formed in said predetermined pattern;
        depositing solder on portions of said chromium oxide layer exposed in said plurality of openings of said resist layer by electroplating; and
        prior to said step of depositing solder by electroplating, washing the outermost surface of said stainless steel sheet with an acid aqueous solution.

2. The method of claim 1, wherein said chromium oxide layer is formed on an underlying oxide layer containing an iron oxide formed on the surface of said stainless steel sheet, and the thickness of an oxide layer composed of said chromium oxide layer and said underlying oxide layer is 8 nm or more.

3. The method of claim 1, wherein said step of washing the outermost surface is executed so that the thickness of the oxide layer composed of said chromium oxide layer and said underlying oxide layer increases by 5% or more by the acid washing.

4. The method of claim 1, wherein said step of depositing solder by electroplating is executed at a current density of 0.5 A/dm$^2$ to 4 A/dm$^2$ by a rack plating method.

5. A solder bump transfer sheet produced by a method comprising the steps of:
    forming on the surface of a stainless steel sheet a chromium oxide layer as an outermost surface wherein the chromium oxide layer contains substantially no iron oxide formed during formation of the chromium oxide layer; and
    forming a plurality of solder bumps placed in a predetermined pattern on said chromium oxide layer,
    wherein said stainless steel sheet has a conductive surface, said chromium oxide layer being formed on said conductive surface, and said plurality of solder bumps are formed by electroplating,
    said chromium oxide layer is formed by a process including a step of thermally oxidizing the conductive surface of said stainless steel sheet, and
    said step of forming a plurality of solder bumps comprises the steps of:
        forming a resist layer o said chromium oxide layer, the resist layer having a plurality of openings formed in said predetermined pattern;
        depositing solder on portions of said chromium oxide layer exposed in said plurality of openings of said resist layer by electroplating; and
        prior to said step of depositing solder by electroplating, washing the outermost surface of said stainless steel sheet with an acid aqueous solution.

6. The solder bump transfer sheet of claim 5, wherein said chromium oxide layer is formed on an underlying oxide layer containing an iron oxide formed on the surface of said stainless steel sheet, and the thickness of an oxide layer composed of said chromium oxide layer and said underlying oxide layer is 8 nm or more.

* * * * *